(12) United States Patent
Kawai

(10) Patent No.: US 7,573,238 B2
(45) Date of Patent: Aug. 11, 2009

(54) VOLTAGE DETECTION DEVICE AND ELECTRIC VEHICLE INCLUDING VOLTAGE DETECTION DEVICE

(75) Inventor: Hirokazu Kawai, Mie (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 585 days.

(21) Appl. No.: 11/463,255

(22) Filed: Aug. 8, 2006

(65) Prior Publication Data

US 2009/0128158 A1     May 21, 2009

(30) Foreign Application Priority Data

Aug. 9, 2005   (JP)  ............................. 2005-230834

(51) Int. Cl.
*H02J 7/00* (2006.01)
*H02J 7/04* (2006.01)
*H02J 7/16* (2006.01)
*G01N 27/416* (2006.01)

(52) U.S. Cl. .................. 320/132; 320/136; 320/162; 320/166; 324/433

(58) Field of Classification Search ................. 324/433, 324/434; 320/117, 118, 130, 132, 157, 162, 320/166, 136
See application file for complete search history.

(56) References Cited

U.S. PATENT DOCUMENTS

| 5,712,568 | A  | * | 1/1998 | Flohr et al. ................. 324/434 |
| 2004/0001996 | A1 | * | 1/2004 | Sugimoto ..................... 429/61 |
| 2004/0041569 | A1 | * | 3/2004 | Furukawa .................... 324/433 |

FOREIGN PATENT DOCUMENTS

JP     2002-040064     2/2002

* cited by examiner

*Primary Examiner*—Akm E Ullah
*Assistant Examiner*—Alexis Boateng
(74) *Attorney, Agent, or Firm*—Workman Nydegger

(57) ABSTRACT

A voltage detection device for accurately correcting detection errors with voltage greater than an internal reference voltage. The device includes a first switch group of switches for obtaining the voltage across a battery block in a battery pack. A charge-discharge unit has two or more capacitors connected in series or in parallel. A voltage detector detects discharge voltage of the capacitors. In a first period, the capacitors are series-connected and charged with the voltage of the battery block. In a second period, the capacitors charged in the first period are series-connected and discharged, and the voltage detector detects the discharge voltage. In a third period, the capacitors are parallel-connected and each capacitor is charged with an internal reference voltage. In the fourth period, the capacitors charged in the third period are series-connected and discharged, and the detection error is corrected using the discharge voltage as a reference.

13 Claims, 3 Drawing Sheets

VOLTAGE DETECTION DEVICE AND ELECTRIC VEHICLE INCLUDING VOLTAGE DETECTION DEVICE

CROSS-REFERENCE TO RELATED APPLICATIONS

This application is based upon and claims the benefit of priority from the prior Japanese Patent Application No. 2005-230834, filed on Aug. 9, 2005, the entire contents of which are incorporated herein by reference.

BACKGROUND OF THE INVENTION

The present invention relates to a voltage detection device for detecting voltage of a battery pack and to an electric vehicle incorporating the voltage detection device.

Japanese Laid-Open Patent Publication No. 2002-040064 describes a device for detecting voltage of a battery block in a battery pack.

In detail, Japanese Laid-Open Patent Publication No. 2002-040064 describes a battery voltage detection device including a single capacitor connected in parallel to a reference voltage generator. The reference voltage generator includes a constant voltage step-down circuit, such as a zener diode. In the battery voltage detection device, a switch is used to charge the capacitor with a rechargeable battery included in the battery pack. A voltage detector of the battery voltage detection device is supplied with reference voltage, or the voltage across the charged capacitor, to correct an internal reference voltage.

In the prior art, the battery voltage detection device is not connected to a reference voltage generation power supply. This is advantageous in that the internal reference voltage can be solely and frequently corrected. However, the battery voltage detection device cannot generate an internal reference voltage that is greater than or equal to the step down voltage of the zener diode, which functions as the constant voltage step-down circuit.

Therefore, when detecting a relatively high battery block voltage with the battery voltage detection device of the prior art, detection errors cannot be accurately corrected.

SUMMARY OF THE INVENTION

The present invention provides a voltage detection device for accurately correcting detection errors in voltages greater than or equal to an internal reference voltage and an electric vehicle incorporating such a voltage detection device.

One aspect of the present invention is a voltage detection device for detecting voltage across one of a plurality of series-connected battery blocks, each including one or more rechargeable batteries. The voltage detection device is provided with a first switch group, a charge-discharge unit, and a voltage detector. The first switch group includes a plurality of switches connected to the plurality of battery blocks, for obtaining the voltage across the one of the battery blocks. The charge-discharge unit includes two or more capacitors charged with the voltage across the one of the battery block that is supplied via two of the plurality of switches or charged with a predetermined internal reference voltage. A connection state of the two or more capacitors is switchable between series connection and parallel connection. The voltage detector receives a discharge voltage of the two or more capacitors and detects the discharge voltage. In a first period, the two or more capacitors are connected in series and charged with the voltage across the one of the battery blocks. In a second period, the two or more capacitors that have been charged in the first period are connected in series and discharged, with the voltage detector detecting a discharge voltage of the capacitors. In a third period, the two or more capacitors are connected in parallel and each capacitor is charged with the internal reference voltage. In a fourth period, the two or more capacitors that have been charged in the third period are connected in series and discharged. A detection error of the voltage detector is corrected using a discharge voltage of the capacitors as a reference.

An electric vehicle includes a battery pack including a plurality of series-connected battery blocks, and a voltage detection device for detecting a voltage across one of the battery blocks. The voltage detection device includes a first switch group, a charge-discharge unit, and a voltage detector. The first switch group includes a plurality of switches, connected to the plurality of battery blocks, for obtaining the voltage across the one of the battery blocks. The charge-discharge unit includes two or more capacitors charged with the voltage across the one of the battery block that is supplied via two of the plurality of switches or charged with a predetermined internal reference voltage. A connection state of the two or more capacitors is switchable between series connection and parallel connection. The voltage detector receives a discharge voltage of the two or more capacitors and detects the discharge voltage. In a first period, the two or more capacitors are connected in series and charged with the voltage across the one of the battery blocks. In a second period, the two or more capacitors that have been charged in the first period are connected in series and discharged, with the voltage detector detecting a discharge voltage of the capacitors. In a third period, the two or more capacitors are connected in parallel and each capacitor is charged with the internal reference voltage. In a fourth period, the two or more capacitors that have been charged in the third period are connected in series and discharged, with a detection error of the voltage detector being corrected using a discharge voltage of the capacitors as a reference.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
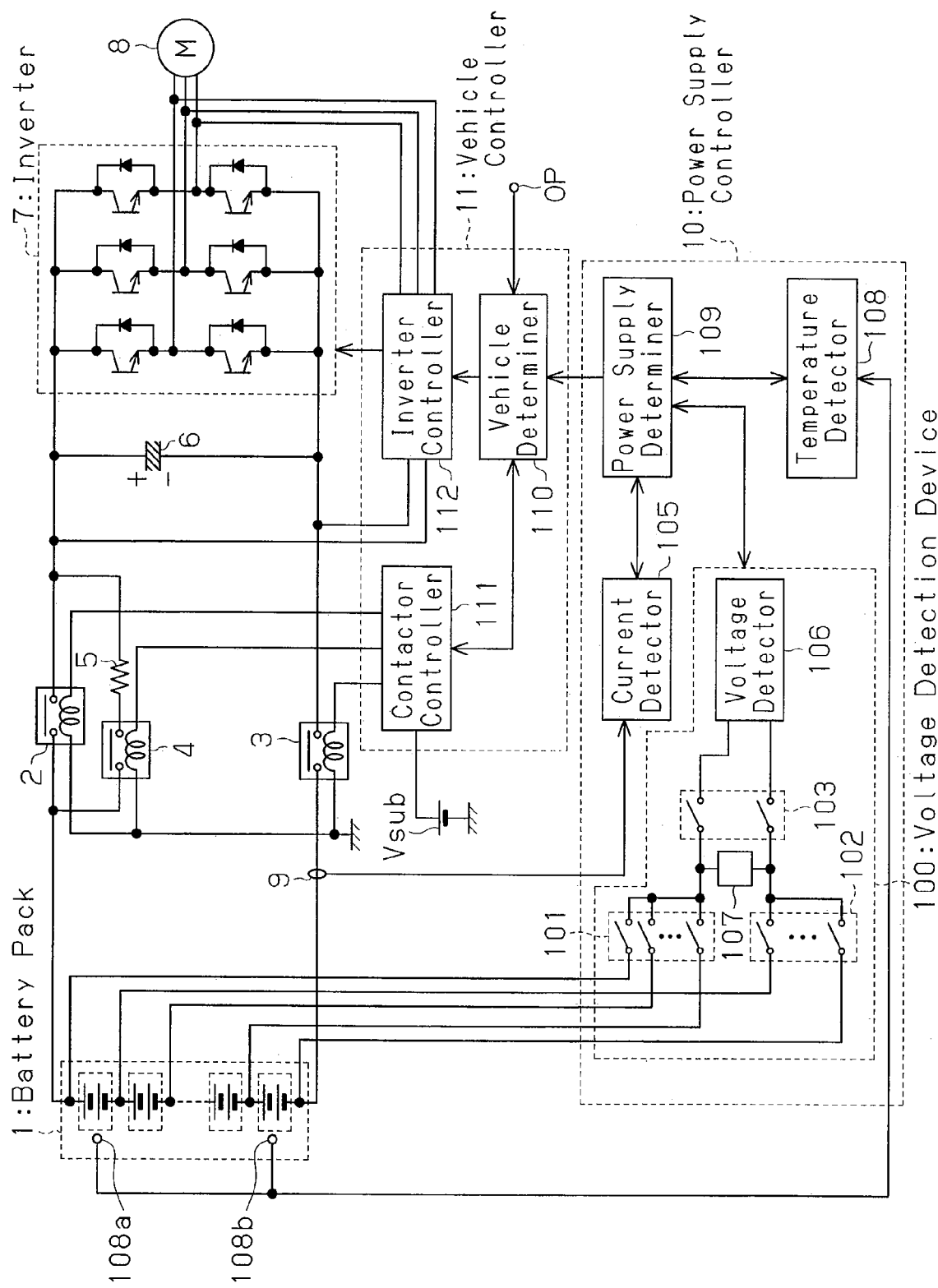
FIG. 1 is a schematic block diagram showing the structure of an electric vehicle incorporating a voltage detection device according to a preferred embodiment of the present invention.

In the drawings, like elements are used for like elements throughout.

A voltage detection device 100 according to a preferred embodiment of the present invention will now be described with reference to FIGS. 1, 2, and 3. FIG. 1 is a block diagram showing the structure of an electric vehicle incorporating the voltage detection device 100 of the preferred embodiment. As shown in FIG. 1, the electric vehicle includes a battery pack 1, a high side contactor 2, a low side contactor 3, a precharge contactor 4, a limiting resistor 5, a capacitor 6, an inverter 7, a motor generator 8, a current sensor 9, a power supply controller 10, and a vehicle controller 11.

The battery pack 1, which is formed by a plurality of series-connected battery blocks, is a power supply having a total voltage of 300 V. Each battery block includes a plurality of series-connected rechargeable batteries having a relatively low voltage. The rechargeable battery may be a sealed nickel-metal hydride battery (nickel hydrogen storage battery) having basic characteristics, such as energy density, power density, and cycle life, that are superior. The rechargeable battery may also be a lithium ion rechargeable battery, a nickel-cadmium rechargeable battery, or a rechargeable lead battery.

The battery pack 1 has a positive pole, connected to a first terminal of the high side contactor 2, and a negative pole, connected to a first terminal of the low side contactor 3. The precharge contactor 4 and the limiting resistor 5 form a series circuit. The series circuit is connected in parallel to the high side contactor 2.

The high side contactor 2, the low side contactor 3, and the precharge contactor 4 each have a movable contact, a fixed contact, and a coil for operating the movable contact.

Each coil has one end connected to a ground potential and another end connected to an auxiliary power supply of voltage Vsub via the vehicle controller 11. The movable contact operates when the voltage Vsub of the auxiliary power supply is applied to the coil. This switches the contacts between a connected state and a disconnected state.

The capacitor 6 is a smoothing capacitor connected between a second terminal of the high side contactor 2 and a second terminal of the low side contactor 3. The capacitor 6 suppresses fluctuations in the voltage applied to the inverter 7 and supplies the motor generator 8 with stable voltage.

The inverter 7 includes, for example, plural sets of a transistor and a diode that can be switched at high speeds, such as insulated gate bipolar transistors (IGBTs). The inverter 7 converts the supplied direct current into an alternating current of three phases and sequentially applies the voltage to each phase of the motor generator 8. The voltage drives the motor generator 8.

The motor generator 8 is controlled by the inverter 7. The motor generator 8 is driven, for example, by applying voltage to a stator coil to produce torque that acts on magnets embedded in a rotor. The motor generator 8 functions as a three-phase AC generator or a three-phase AC motor. The motor generator 8 charges the battery pack 1 when functioning as a generator and consumes power supplied from the battery pack 1 when functioning as a motor.

The vehicle controller 11 includes a vehicle determiner 110, a contactor controller 111, and an inverter controller 112.

The vehicle determiner 110 is provided with an operation signal via an operation signal input terminal OP. The operation signal is generated when a driver operates an ignition key, an accelerator, a gearshift lever, or a brake (not shown). The vehicle determiner 110 provides the contactor controller 111, the inverter controller 112, and the power supply controller 10 with instructions that are in accordance with the operation signal provided to the vehicle determiner 110.

The contactor controller 111 controls the conduction state and the non-conduction state of each of the contactors 2, 3, and 4 by applying the auxiliary power supply voltage Vsub to the coils of the high side contactor 2, the low side contactor 3, and the precharge contactor 4.

The inverter controller 112 is supplied with a voltage applied to the inverter 7 and is provided with a three-phase feedback voltage signal, which is an output signal of the inverter 7. The inverter controller 112 provides the inverter 7 with a control signal for controlling each transistor of the inverter 7 based on the signal provided to the inverter controller 112 to control the speed of the rotation produced by the motor generator 8 with the inverter 7.

The power supply controller 10 includes the voltage detection device 100, a current detector 105, a temperature detector 108, and a power supply determiner 109.

The current detector 105 reads the value of the current flowing toward the negative pole of the battery pack 1 that is detected by the current sensor 9 when instructed by the power supply determiner 109 or in predetermined current measurement cycles. The current detector 105 then provides the power supply determiner 109 with the current value. The current sensor 9 detects the current flowing toward the negative pole of the battery pack 1 with, for example, a Hall sensor, which detects an electromagnetic field generated by current flowing through a conductive line.

The temperature detector 108 detects the temperature of the battery pack 1 with temperature sensors 108a and 108b arranged in the vicinity of the battery pack 1 when instructed by the power supply determiner 109 or in predetermined current measurement cycles. The temperature sensors 108a and 108b may be thermistors. Although only two temperature sensors are illustrated in the drawing of the present embodiment, any number of temperature sensors may be used. It is however preferable that two or more temperature sensors be used to compensate a temperature difference in the battery pack 1.

The voltage detection device 100 detects the voltage across any battery block in the battery pack 1. The voltage detection device 100 will be described in detail later with reference to FIG. 2.

The power supply determiner 109 receives inputs from the voltage detection device 100 detecting the voltage across each battery block in the battery pack 1, the temperature detector 108 detecting the temperature of the battery pack 1, and the current detector 105 detecting the current flowing through the battery pack 1. The power supply determiner 109 monitors the state of the battery pack 1 with the input information of the battery pack 1 and provides the vehicle controller 11 with the information. The vehicle controller 11 executes inverter control and contactor control in accordance with the state of the battery pack 1 that is determined based on the information from the power supply determiner 109.

The voltage detection device 100, which is the feature of the present invention, will now be described in detail with reference to FIG. 2. FIG. 2 is a circuit diagram showing in detail only the battery pack 1, the voltage detection device 100, and the power supply determiner 109 of FIG. 1.

Figure 2:
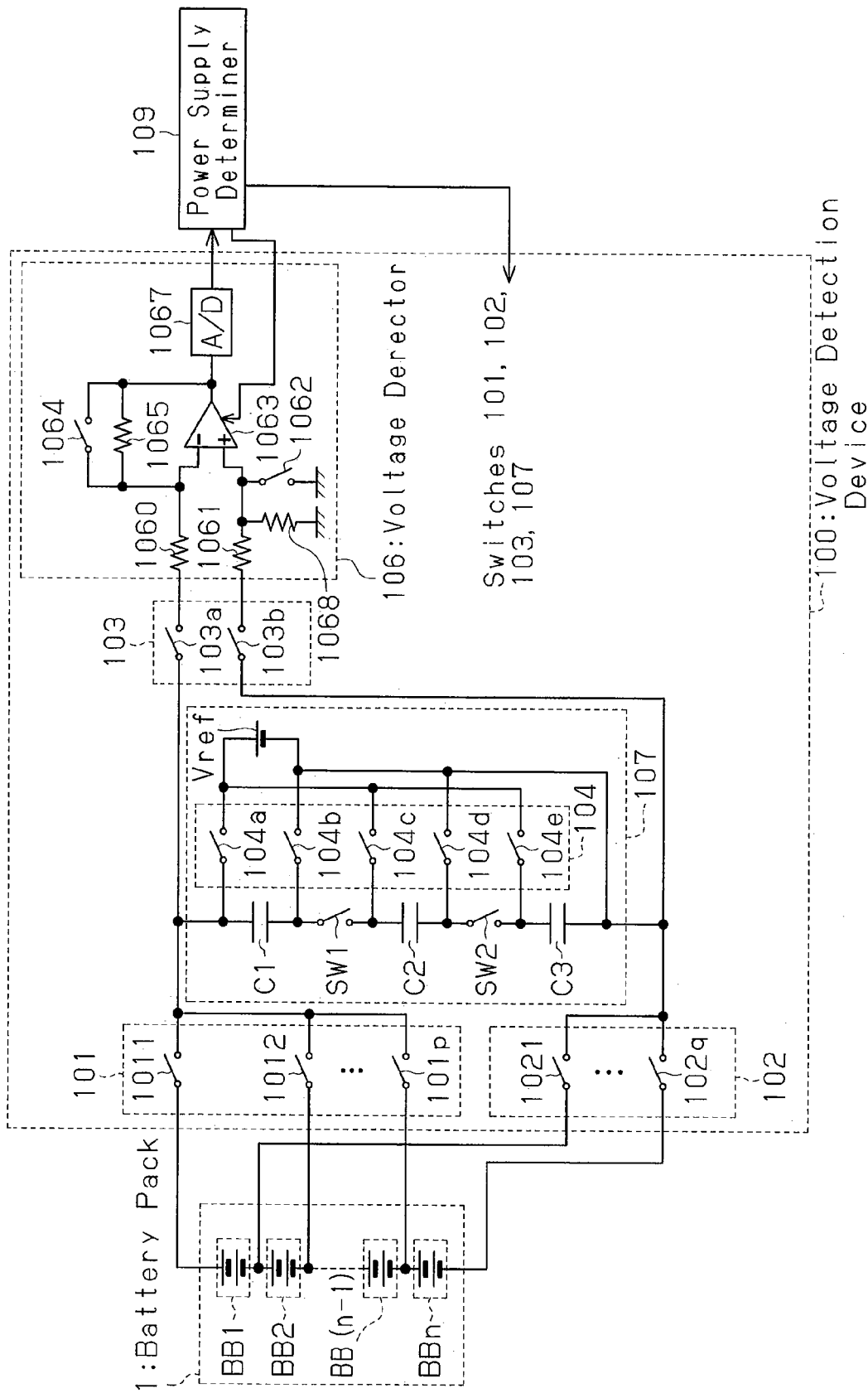
FIG. 2 is a circuit diagram of the voltage detection device shown in FIG. 1.

In FIG. 2, the voltage detection device 100 includes a first multiplexer 101, a second multiplexer 102, a sample switch unit 103, a voltage detector 106, and a charge-discharge unit 107. The first multiplexer 101 and the second multiplexer 102 form a first switch group for obtaining the voltage across any battery block of the battery pack 1. In FIG. 2, the battery pack 1 includes an n number of battery blocks, which are respectively denoted by reference numerals BB1, BB2, . . . , BB(n−1), and BBn from the positive pole toward the negative pole of the battery pack 1.

Each of the first multiplexer 101 and the second multiplexer 102 includes a plurality of switches. Each of the switches of the first and second multiplexers 101 and 102 has a first terminal connected to the positive pole of the battery pack 1, a node between the battery blocks BB1 and BB2 to BB(n−1) and BBn of the battery pack 1, or the negative pole of the battery pack 1. Each of the switches 1011 and 1012 to 101p of the first multiplexer 101 has a second terminal connected to a switch 103a of the sample switch unit 103. Each of the switches 1021 to 102q of the second multiplexer 102 has a second terminal connected to a switch 103b of the sample switch unit 103. In the present invention, the switch 103a corresponds to the third switch, and the switch 103b corresponds to the forth switch.

One of the plurality of switches (p number of switches in FIG. 2) of the first multiplexer 101 and one of the plurality of switches (q number of switches in FIG. 2) of the second multiplexer 102 are selected. The selected two switches are turned on and the switches that are not selected are all turned off. This enables the first multiplexer 101 and the second multiplexer 102 to obtain the voltage across any one of the battery blocks in the battery pack 1.

The total number p of the switches in the first multiplexer 101, the total number q of the switches in the second multiplexer 102, and the number n of the battery blocks in the battery pack 1 satisfy the following relationship.

$$p+q=n+1 \tag{1}$$

In the structure shown in FIG. 2, for example, the positive pole of the battery pack 1 is connected to the first terminal of the switch 1011 of the first multiplexer 101. A node between the battery blocks BB1 and BB2 of the battery pack 1 is connected to the first terminal of the switch 1021 of the second multiplexer 102. The node between the battery blocks BB2 and BB3 of the battery pack 1 is connected to the first terminal of the switch 1012 in the first multiplexer 101. A node between the battery blocks BB(n−1) and BBn of the battery pack 1 is connected to the first terminal of the switch 101p in the first multiplexer 101. The negative pole of the battery pack 1 is connected to a first terminal of the switch 102q in the second multiplexer 102.

For example, the voltage across the battery block BB2 is obtained by turning on the switch 1021 of the second multiplexer 102 and the switch 1012 of the first multiplexer 101 and turning off the other switches.

The sample switch unit 103 includes the switch 103a and the switch 103b. The switch 103a has a first terminal connected to the second terminal of each switch in the first multiplexer 101 and a second terminal connected to the voltage detector 106. The switch 103b has a first terminal connected to the second terminal of each switch in the second multiplexer 102 and a second terminal connected to the voltage detector 106. The switches 103a and 103b are turned on and off in a cooperative manner.

The charge-discharge unit 107 is connected between a first node, which is located between each switch of the first multiplexer 101 and the switch 103a of the sample switch unit 103, and a second node, which is located between each switch of the second multiplexer 102 and the switch 103b of the sample switch unit 103. The charge-discharge unit 107 includes a correction switch unit 104, capacitors C1, C2, and C3, switches SW1 and SW2, and an internal power supply having a highly accurate reference voltage Vref. In the present invention, the switches SW1 and SW2 correspond to the second switch group.

The capacitor C1, the switch SW1, the capacitor C2, the switch SW2, and the capacitor C3 are connected in series in this order between the first node, which is located between each switch of the first multiplexer 101 and the switch 103a of the sample switch unit 103, and the second node, which is located between each switch of the second multiplexer 102 and the switch 103b of the sample switch unit 103. The switches SW1 and SW2 are turned on and off in a cooperative manner.

The correction switch unit 104 includes switches 104a-104e. The switch 104a has a first terminal connected to a high potential terminal of the capacitors C1, and a second terminal connected to a positive pole of the internal power supply having the highly accurate reference voltage Vref (e.g., 5 V). The switch 104b has a first terminal connected to a low potential terminal of the capacitors C1, and a second terminal connected to a negative pole of the internal power supply. The switch 104c has a first terminal connected to a high potential terminal of the capacitors C2, and a second terminal connected to the positive pole of the internal power supply. The switch 104d has a first terminal connected to a low potential terminal of the capacitors C2, and a second terminal connected to the negative pole of the internal power supply. The switch 104e has a first terminal connected to a high potential terminal of the capacitors C3, and a second terminal connected to the positive pole of the internal power supply. The switches 104a-104e are turned on and off in a cooperative manner. In the present invention, the switches 104a-104e correspond to the third switch group.

The connection state of the capacitors C1, C2, and C3 is switched to be in series connection to any one of the battery blocks in the battery pack 1 or to the voltage detector 106 or to be in parallel connection to the internal power supply of the charge-discharge unit 107. This switching is performed by controlling the first multiplexer 101 and the second multiplexer 102, the switches SW1 and SW2 of the charge-discharge unit 107, the switches 103a and 103b, and the switches 104a-104e.

The voltage detector 106 includes a differential amplifier circuit, which has resistors 1060, 1061, 1065, and 1068 and an operation amplifier 1063. Further, the voltage detector 106 includes switches 1062 and 1064 that are turned on and off in a cooperative manner and an A/D converter 1067. The voltage detector 106 detects a discharge voltage of the charge-discharge unit 107 that is supplied via each of the switches 103a and 103b of the sample switch unit 103 when the switches 1062 and 1064 are off. Then, the voltage detector 106 performs A/D conversion on the detected discharge voltage and provides a digital signal indicating the discharge voltage to the power supply determiner 109. When the switches 1062 and 1064 are on, the detection voltage of the voltage detector 106 is zero.

The power supply determiner 109 controls the switches of the first multiplexer 101 and the second multiplexer 102, the switches 103a and 103b of the sample switch unit 103, the switches SW1 and SW2, and the switches 104a-104e of the correction switch unit 104. The power supply determiner 109 controls the above switches, and monitors the voltage across each battery block of the battery pack 1 during a certain period and corrects the detection errors of the voltage detector 106 during other periods.

The control of each switch of the power supply determiner 109 will now be described in detail.

During a first period, the power supply determiner 109 turns on two switches of the first multiplexer 101 and the second multiplexer 102 and obtains the voltage across a battery block in the battery pack 1. At the same time, the power supply determiner 109 turns on the switches SW1 and SW2, turns off the switches 104a-104e, and turns off the switches 103a and 103b. The capacitors C1, C2, and C3 are charged with the voltage across the battery block in the battery pack 1 that is obtained by the first multiplexer 101 and the second multiplexer 102. In this state, the capacitors C1, C2, and C3 are connected in series.

During a second period, the power supply determiner 109 turns off all the switches of the first multiplexer 101 and the second multiplexer 102 and turns on the switches 103a and 103b to discharge the capacitors C1, C2, and C3 that have been charged in the first period. In this state, the switches SW1 and SW2 remain on and the switches 104a-104e remain off. Thus, the capacitors C1, C2, and C3 are connected in series. Since the switches 103a and 103b are on, the discharge voltage of the capacitors C1, C2, and C3 is supplied to the voltage detector 106 and detected. The power supply determiner 109 receives a voltage value that is detected by the voltage detector 106 and monitors whether the value is in a normal range.

During a third period, the power supply determiner 109 turns off the switches 103a and 103b, turns off the switches SW1 and SW2, and turns on the switches 104a-104e to charge the capacitors C1, C2, and C3 with the highly accurate reference voltage Vref. All the switches of the first multiplexer 101 and the second multiplexer 102 remain off. In this state, the switches SW1 and SW2 are off. Thus, the capacitors C1, C2, and C3 are connected in parallel and each of the capacitors C1, C2, and C3 is charged with the highly accurate reference voltage Vref.

During a fourth period, the power supply determiner 109 turns on the switches 103a and 103b, turns on the switches SW1 and SW2, and turns off the switches 104a-104e to discharge the capacitors C1, C2, and C3 that have been charged in the third period. All the switches of the first multiplexer 101 and the second multiplexer 102 remain off. In this state, the capacitors C1, C2, and C3 are connected in series. Since the switches 103a and 103b are on, the discharge voltage of the capacitors C1, C2, and C3 is supplied to the voltage detector 106 and detected. The power supply determiner 109 receives a voltage value detected by the voltage detector 106 and corrects detection errors of the voltage detector 106 using the received value as a reference. More specifically, the power supply determiner 109 corrects an offset voltage of the operation amplifier 1063 of the voltage detector 106.

The power supply determiner 109 may further control the switches 1062 and 1064 of the voltage detector 106. In this case, the switches 1062 and 1064 of the voltage detector 106 are turned on in the first and third periods and turned off in the second and fourth periods.

The operation of the voltage detection device 100 of the present invention having the above-described structure will now be described with reference to FIGS. 2 and 3. FIG. 3 is a timing waveform diagram illustrating the operation of each switch in the voltage detection device 100.

Figure 3:
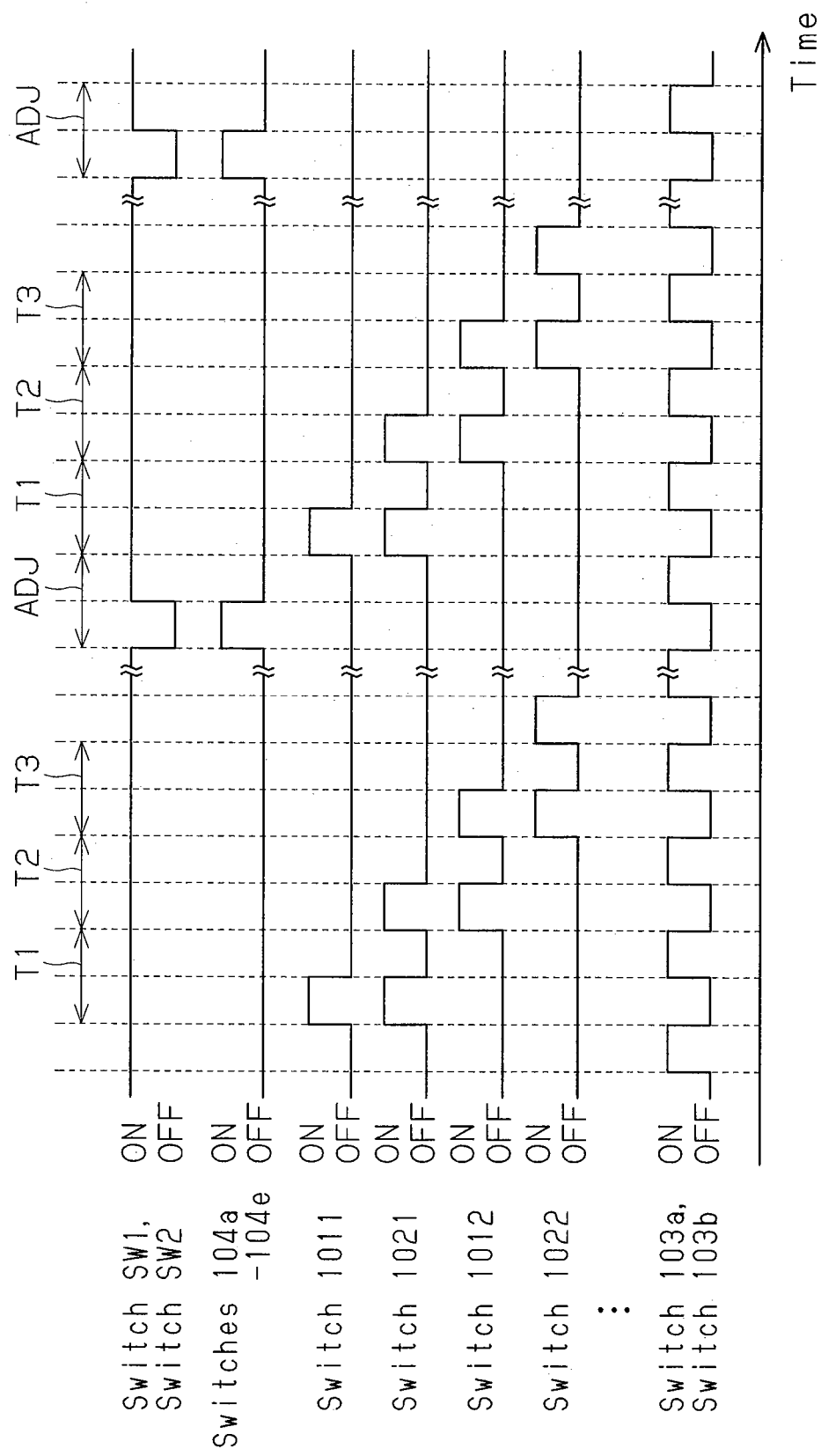
FIG. 3 is a timing waveform chart describing the switching operation of the voltage detection device shown in FIG. 1.

The switches SW1 and SW2 are maintained on and the switches 104a-104e are maintained off throughout period T1 in FIG. 3.

In the first half (corresponding to the first period) of period T1, the switch 1011 of the first multiplexer 101 and the switch 1021 of the second multiplexer 102 are turned on. The other switches of the first multiplexer 101 and the second multiplexer 102 are all turned off. As a result, the voltage across the battery block BB1 in the battery pack 1 is obtained. The switches SW1 and SW2 are turned on, the switches 104a-104e are turned off, and the switches 103a and 103b are turned off. As a result, the series-connected capacitors C1, C2, and C3 are charged with the voltage across the battery block BB1 in the battery pack 1.

In the second half (corresponding to the second period) of period T1, the switch 1011 of the first multiplexer 101 and the switch 1021 of the second multiplexer 102 are turned off (causing all the switches of the first multiplexer 101 and the second multiplexer 102 to be off), and the switches 103a and 103b are turned on. The discharge voltage of the series-connected capacitors C1, C2, and C3 that have been charged in the first half (corresponding to the first period) of period T1 is supplied to the voltage detector 106.

In this manner, the voltage across the battery block BB1 in the battery pack 1 is inspected in period T1.

Throughout period T2 shown in FIG. 3, the switches SW1 and SW2 are maintained on and the switches 104a-104e are maintained off.

In the first half (corresponding to the first period) of period T2, the switch 1021 of the second multiplexer 102 and the switch 1012 of the first multiplexer 101 are turned on, and the other switches of the first multiplexer 101 and the second multiplexer 102 are all turned off. As a result, the voltage across the battery block BB2 in the battery pack 1 is obtained. The switches SW1 and SW2 are turned on, the switches 104a-104e are turned off, and the switches 103a and 103b are turned off. As a result, the series-connected capacitors C1, C2, and C3 are charged with the voltage across the battery block BB2 of the battery pack 1.

In the second half (corresponding to the second period) of the period T2, the switch 1021 of the second multiplexer 102 and the switch 1021 of the first multiplexer 101 are turned off (causing all the switches of the first multiplexer 101 and the second multiplexer 102 to be off), and the switches 103a and 103b are turned on. The discharge voltage of the series-connected capacitors C1, C2, and C3 that have been charged in the first half (corresponding to the first period) of the period T2 is supplied to the voltage detector 106.

In this manner, the voltage across the battery block BB2 in the battery pack 1 is inspected in period T2.

The above operation is performed on each battery block in the battery pack 1 so that the voltage across each of the battery blocks BB1 to BBn of the battery pack 1 is inspected sequentially.

Next, detection errors of the voltage detector 106 are corrected during period ADJ shown in FIG. 3.

Throughout period ADJ in FIG. 3, all the switches of the first multiplexer 101 and the second multiplexer 102 remain off.

In the first half (corresponding to the third period) of period ADJ, the switches SW1 and SW2 are turned off, the switches 104a-104e are turned on, and the switches 103a and 103b are turned off. Each of the parallel-connected capacitors C1, C2, and C3 are charged with the highly accurate reference voltage Vref.

In the second half (corresponding to the fourth period) of the period ADJ, the switches SW1 and SW2 are turned on, the switches 104a-104e are turned off, and the switches 103a and 103b are turned on. The capacitors C1, C2, and C3 that have been charged in the first half (corresponding to the third period) of the period ADJ are connected in series and discharged. The discharge voltage is supplied to the voltage detector 106.

The capacitors C1, C2, and C3 are connected in parallel and each of the capacitors C1, C2, and C3 are charged with the highly accurate reference voltage Vref in the first half (corresponding to the third period) of the period ADJ. Thus, the discharge voltage of the series-connected capacitors C1, C2, and C3 is three times greater than the highly accurate reference voltage Vref in the second half (corresponding to the fourth period) of period ADJ. The power supply determiner 109 corrects the detection errors by adjusting the offset voltage of the voltage detector 106 using the voltage detected by the voltage detector 106 that is three times greater than the highly accurate reference voltage Vref. In this manner, the voltage detector 106 corrects detection errors with voltage that is greater than or equal to the highly accurate reference voltage Vref.

The above-described structure enables the voltage detection device of the present invention to correct detection errors with a voltage that is greater than or equal to its internal reference voltage even when the internal reference voltage is relatively low. As a result, the voltage detection device of the present invention accurately corrects detection errors even when detecting a high battery block voltage. Further, the capacitors and the switches are inexpensive. Thus, the voltage detection device of the present invention is inexpensive.

It should be apparent to those skilled in the art that the present invention may be embodied in many other specific forms without departing from the spirit or scope of the invention. Particularly, it should be understood that the present invention may be embodied in the following forms.

In the present embodiment, the charge-discharge unit 107 has three capacitors, namely, the capacitors C1, C2, and C3. However, the present invention is not limited in such a manner and the number of the capacitors may be changed in accordance with the desirable voltage value for correcting the detection errors of the voltage detection device. As long as the charge-discharge unit 107 has at least two capacitors, detection errors may be corrected with voltage that is greater than or equal to the internal reference voltage.

The present invention is applicable to, for example, a voltage detection device of a battery pack that is mounted on an electric vehicle, such as a personal electric vehicle (PEV), a hybrid electric vehicle (HEV), or a hybrid electric vehicle using a fuel cell and a rechargeable battery.

The present examples and embodiments are to be considered as illustrative and not restrictive, and the invention is not to be limited to the details given herein, but may be modified within the scope and equivalence of the appended claims.

What is claimed is:

1. A voltage detection device for detecting voltage across one of a plurality of series-connected battery blocks, each including one or more rechargeable batteries, the voltage detection device comprising:
   a first switch group, including a plurality of switches connected to the plurality of battery blocks, for obtaining the voltage across the one of the battery blocks;
   a charge-discharge unit including two or more capacitors charged with the voltage across the one of the battery block that is supplied via two of the plurality of switches or charged with a predetermined internal reference voltage, wherein a connection state of the two or more capacitors is switchable between series connection and parallel connection; and
   a voltage detector for receiving a discharge voltage of the two or more capacitors and detecting the discharge voltage;
   wherein in a first period, the two or more capacitors are connected in series and charged with the voltage across the one of the battery blocks;
   in a second period, the two or more capacitors that have been charged in the first period are connected in series and discharged, with the voltage detector detecting a discharge voltage of the capacitors;
   in a third period, the two or more capacitors are connected in parallel and each capacitor is charged with the internal reference voltage; and
   in a fourth period, the two or more capacitors that have been charged in the third period are connected in series and discharged, with a detection error of the voltage detector being corrected using a discharge voltage of the capacitors as a reference.

2. The voltage detection device according to claim 1, wherein the charge-discharge unit includes:
   a second switch group including one or more switches arranged between the two or more capacitors and turned on and off in a cooperative manner; and
   a third switch group including a plurality of switches arranged between the two or more capacitors and a power supply for supplying the internal reference voltage and turned on and off in a cooperative manner.

3. The voltage detection device according to claim 2, wherein the plurality of switches of the third switch group include:
   a first switch connected between a first terminal of one of the two or more capacitors and a positive pole of the power supply for supplying the internal reference voltage: and
   a second switch connected between a second terminal of the one of the two or more capacitors and a negative pole of the power supply for supplying the internal reference voltage.

4. The voltage detection device according to claim 2, wherein in the first, second, and fourth periods, the one or more switches of the second switch group are turned on and the plurality of switches of the third switch group are turned off so that the two or more capacitors are connected in series.

5. The voltage detection device according to claim 2, wherein in the third period, the one or more switches of the second switch group are turned off and the plurality of switches of the third switch group are turned on so that the two or more capacitors are connected in parallel.

6. The voltage detection device according to claim 2, further comprising:
   a third switch connected between the voltage detector and a high potential terminal of the two or more capacitors that are connected in series when the one or more switches of the second switch group are turned on and the plurality of switches of the third switch group are turned off; and
   a fourth switch connected between the voltage detector and a low potential terminal of the two or more capacitors that are connected in series when the one or more switches of the second switch group are turned on and the plurality of switches of the third switch group are turned off, wherein the fourth switch is turned on and off cooperatively with the third switch.

7. The voltage detection device according to claim 6, wherein in the first and third periods, the third and fourth switches are turned off to charge the two or more capacitors.

8. The voltage detection device according to claim 6, wherein in the second and fourth periods, the third and fourth switches are turned on to discharge the two or more capacitors.

9. The voltage detection device according to claim 2, wherein the first switch group includes a first multiplexer having a plurality of switches and a second multiplexer having a plurality of switches, with each switch of the first multiplexer being connected between a first terminal of each of the plurality of battery blocks and a high potential terminal of the two or more capacitors that are connected in series when the one or more switches of the second switch group are turned on and the plurality of switches of the third switch group are turned off, and each switch of the second multiplexer is connected between a second terminal of each of the plurality of battery blocks and a low potential terminal of the two or more capacitors that are connected in series when the one or more switches of the second switch group are turned on and the plurality of switches of the third switch group are turned off.

10. The voltage detection device according to claim 9, wherein in the first period, only one of the switches of the first multiplexer is turned on and only one of the switches of the second multiplexer is turned on to charge the two or more capacitors with the voltage across one of the battery blocks.

11. The voltage detection device according to claim 9, wherein in the second, third, and fourth periods, all the switches of the first multiplexer are turned off and all the switches of the second multiplexer are turned off.

12. The voltage detection device according to claim 1, wherein the first period and the second period are repeated while sequentially switching the subject battery blocks until the voltage detection device detects voltages across every one of the battery blocks, and then a detection error of the voltage detector is corrected in the third period and the fourth period.

13. An electric vehicle comprising:
   a battery pack including a plurality of series-connected battery blocks; and
   a voltage detection device for detecting a voltage across one of the battery blocks;
   wherein the voltage detection device includes:
      a first switch group including a plurality of switches, connected to the plurality of battery blocks, for obtaining the voltage across the one of the battery blocks;
      a charge-discharge unit including two or more capacitors charged with the voltage across the one of the battery block that is supplied via two of the plurality of switches or charged with a predetermined internal reference voltage, wherein a connection state of the two or more capacitors is switchable between series connection and parallel connection; and
      a voltage detector for receiving a discharge voltage of the two or more capacitors and detecting the discharge voltage;
   wherein in a first period, the two or more capacitors are connected in series and charged with the voltage across the one of the battery blocks;
   in a second period, the two or more capacitors that have been charged in the first period are connected in series and discharged, with the voltage detector detecting a discharge voltage of the capacitors;
   in a third period, the two or more capacitors are connected in parallel and each capacitor is charged with the internal reference voltage; and
   in a fourth period, the two or more capacitors that have been charged in the third period are connected in series and discharged, with a detection error of the voltage detector being corrected using a discharge voltage of the capacitors as a reference.

* * * * *

UNITED STATES PATENT AND TRADEMARK OFFICE
CERTIFICATE OF CORRECTION

PATENT NO. : 7,573,238 B2  Page 1 of 1
APPLICATION NO. : 11/463255
DATED : August 11, 2009
INVENTOR(S) : Hirokazu Kawai It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 588 days.

Signed and Sealed this

Seventh Day of September, 2010

David J. Kappos
*Director of the United States Patent and Trademark Office*